US012429527B2

(12) United States Patent
Santhamma et al.

(10) Patent No.: US 12,429,527 B2
(45) Date of Patent: Sep. 30, 2025

(54) SYSTEM AND METHOD FOR ONLINE ELECTROCHEMICAL IMPEDANCE SPECTROSCOPY MEASUREMENT IN A BATTERY

(71) Applicant: Garrett Transportation I Inc., Torrance, CA (US)

(72) Inventors: Abhijith Vikraman Pillai Santhamma, Prague (CZ); Hab Collector, Atlanta, GA (US)

(73) Assignee: Garrett Transportation I Inc., Torrance, CA (US)

( * ) Notice: Subject to any disclaimer, the term of this patent is extended or adjusted under 35 U.S.C. 154(b) by 156 days.

(21) Appl. No.: 18/498,996

(22) Filed: Oct. 31, 2023

(65) Prior Publication Data
US 2025/0044366 A1 Feb. 6, 2025

Related U.S. Application Data

(60) Provisional application No. 63/517,484, filed on Aug. 3, 2023.

(51) Int. Cl.
*G01R 31/389* (2019.01)
*G01R 31/00* (2006.01)
*G01R 31/3842* (2019.01)

(52) U.S. Cl.
CPC ......... *G01R 31/389* (2019.01); *G01R 31/006* (2013.01); *G01R 31/3842* (2019.01)

(58) Field of Classification Search
None
See application file for complete search history.

(56) References Cited

U.S. PATENT DOCUMENTS

| | | | |
|---|---|---|---|
| 7,847,557 | B2 | 12/2010 | Yun et al. |
| 8,849,598 | B2 | 9/2014 | Mingant et al. |
| 10,180,460 | B1 | 1/2019 | Castelaz |
| 10,386,422 | B2 | 8/2019 | Christensen et al. |
| 10,566,817 | B2 | 2/2020 | Tkachenko et al. |
| 10,585,146 | B2 | 3/2020 | Christensen et al. |
| 11,435,405 | B2 | 9/2022 | Gong et al. |

(Continued)

FOREIGN PATENT DOCUMENTS

| | | | | |
|---|---|---|---|---|
| CN | 104282965 A | * | 1/2015 | |
| CN | 105594041 A | * | 6/2016 | ........ H01M 8/04097 |

(Continued)

OTHER PUBLICATIONS

Lazanas, et al., Electrochemical Impedance Spectroscopy—A Tutorial, ACS Meas. Sci. Au 2023, 3, 162-193 (2023). (Year: 2023).*

(Continued)

*Primary Examiner* — Rodney E Fuller
(74) *Attorney, Agent, or Firm* — Seager, Tufte & Wickhem LLP

(57) ABSTRACT

Online electrochemical impedance spectroscopy (EIS) circuitry and methods. For mobile installations, such as in a hybrid or electric vehicle, battery management units or battery management systems having EIS circuits can provide additional data regarding the state, health and potential failure of batteries. New topologies for the EIS circuitry are proposed, allowing voltage controlled and current controlled EIS to be performed.

20 Claims, 20 Drawing Sheets

(56) References Cited

U.S. PATENT DOCUMENTS

| | | |
|---|---|---|
| 12,146,920 B2 * | 11/2024 | Kim .................. G07C 5/008 |
| 2013/0069660 A1 | 3/2013 | Bernard et al. |
| 2015/0258907 A1 | 9/2015 | Lee |
| 2020/0300920 A1 | 9/2020 | Christophersen et al. |
| 2021/0215628 A1 | 7/2021 | Christophersen |
| 2021/0359317 A1 | 11/2021 | Kaushik et al. |
| 2022/0091062 A1 | 3/2022 | Gullapalli et al. |
| 2022/0146583 A1 * | 5/2022 | Kim .................. G01R 31/389 |
| 2023/0064240 A1 | 3/2023 | Zhou et al. |
| 2023/0105040 A1 | 4/2023 | Wienhausen et al. |
| 2024/0393275 A1 * | 11/2024 | Zwalua ................ G01N 27/026 |

FOREIGN PATENT DOCUMENTS

| | | | |
|---|---|---|---|
| CN | 109073713 A | * 12/2018 | ......... G01R 31/3662 |
| CN | 109212431 B | * 7/2020 | |
| CN | 116224114 A | * 6/2023 | |
| WO | 2022169652 A1 | 8/2022 | |
| WO | 2022175146 A1 | 8/2022 | |
| WO | 2023035074 A1 | 3/2023 | |

OTHER PUBLICATIONS

Liu, et al., A transformer-enhanced framework for lithium-ion capacity estimation using limited imaginary impedance feature, Journal of Energy Storage, 122 (2025) 116313. (Year: 2025).*

Meddings, et al., Application of electrochemical impedance spectroscopy to commercial Li-ion cells: A review, Journal of Power Sources 480 (2020) 228742. (Year: 2020).*

* cited by examiner

SYSTEM AND METHOD FOR ONLINE ELECTROCHEMICAL IMPEDANCE SPECTROSCOPY MEASUREMENT IN A BATTERY

CROSS REFERENCE TO RELATED APPLICATIONS

The present application claims the benefit of and priority to U.S. Prov. Pat. App. No. 63/517,484, filed on Aug. 3, 2023, titled SYSTEM AND METHOD FOR ONLINE ELECTROCHEMICAL IMPEDANCE SPECTROSCOPY MEASUREMENT IN A BATTERY, the disclosure of which is incorporated herein by reference.

BACKGROUND

A battery management system (BMS) is used in a hybrid or all-electric vehicle to control and manage battery operation. The BMS controls safe operation of the battery of such a vehicle, and also enables estimations of the state of the battery. Such estimations can be highly useful to generate range predictions for the battery and to set boundary conditions for operation, including charging and discharging activities. There are several areas in which BMS can be updated or enhanced. A BMS may include a battery management unit (BMU) and one or more cell management units (CMUs).

Many current BMS models use look-up tables based on lab test data to characterize how a cell will perform under various conditions. However, this characterization of the battery changes as the battery ages. Sophisticated control techniques can be used to reduce errors due to aging. However, accuracy may be enhanced further if parameters can be re-characterized as needed, such as by testing batteries in the vehicle.

Because much of the current battery state data, particularly in relation to aging, is simply an estimate, it has been standard practice to select the boundaries of operating conditions conservatively. For example, in a fast-charging context, operating temperatures, maximum currents, and changes in charging parameters as the battery state of charge (SOC) increases, are all selected to provide wide margins between actual operations and conditions that could have damaging effects, such as causing excess Lithium plating. With better accuracy in the characterization of battery state, narrower margins may be enabled.

Certain battery chemistries add further challenges. For example, lithium iron phosphate (LFP) batteries are promising, having the potential for enhanced safety at lower cost than some other chemistries. However, LFP cells display voltage hysteresis and a flat SOC for a significant portion of the SOC/Voltage curve. Range estimation errors may arise and are reported to be much higher with LFP than some other chemistries. Better estimation accuracy for LFP, and other chemistries, may advance wider adoption.

Electrochemical Impedance Spectroscopy (EIS) is a non-destructive technique for measuring electrical impedances of a material at multiple frequencies to obtain information about internal physical and chemical processes. EIS may be performed on a battery, for example. In a Potentiostatic EIS, a sinusoidal voltage perturbation can be applied to a device under test, and resultant current excitation is measured while testing is performed at several frequencies. In Galvanostatic EIS, a sinusoidal current perturbation is applied, and resulting potential is measured while testing is performed at several frequencies.

New and alternative systems and methods for determining battery state are desired. Of particular interest is the use of EIS for vehicle battery state determination.

OVERVIEW

The present inventors have recognized that a problem to be solved is the need for new and/or alternative systems and methods for obtaining EIS measurements from batteries in a vehicle. In particular, online testing in the vehicle itself is desired.

A first illustrative and non-limiting example takes the form of a power system comprising: a first battery subcircuit; a second battery subcircuit; an electrochemical impedance spectroscopy (EIS) measurement circuit coupled to each of the first battery subcircuit and the second battery subcircuit; and a control circuitry coupled to the EIS measurement circuit, the control circuitry configured to perform an EIS test by: issuing a first control signal to transfer first energy from the first battery subcircuit to the second battery subcircuit; and synchronously measuring cell voltages and current in the second battery subcircuit as the first energy is transferred.

Additionally or alternatively, the control circuitry is further configured to perform the EIS test by: issuing a second control signal to transfer second energy from the second battery subcircuit to the first battery subcircuit; and synchronously measuring cell voltages and current in the first battery subcircuit as the second energy is transferred.

Additionally or alternatively, the first and second energy are approximately equal.

Additionally or alternatively, the EIS measurement circuit includes: a transformer having a primary winding and a secondary winding; a first current sensor configured to measure current in the first battery subcircuit; a second current sensor configured to measure current in the second battery subcircuit; a first switch configured to control current in the first battery subcircuit, the first switch coupling the first battery subcircuit to the transformer primary winding; and a second switch configured to control current in the second battery subcircuit, the second switch coupling the second battery subcircuit to the transformer secondary winding.

Additionally or alternatively, the control circuitry is configured to issue the first control signal to close the first switch, and issues a second control signal to close the second switch, such that the first energy is transferred form the first battery subcircuit to the transformer and then from the transformer to the second battery subcircuit.

Additionally or alternatively, the control circuitry determines a reference current, and applies a proportional-integral control strategy to control current in the second battery subcircuit by controlling a switch that controls transfer of the first energy. Additionally or alternatively, the reference current is a time varying current configured to sweep through several frequencies during the EIS test.

Additionally or alternatively, the EIS measurement circuit includes a transformer for transferring power from the first battery circuit to the second battery circuit. Additionally or alternatively, the EIS measurement circuit has a flyback converter design. Additionally or alternatively, the EIS measurement circuit has an isolated full bridge converter design. Additionally or alternatively, the EIS measurement circuit has an isolated half-bridge converter design. Additionally or alternatively, the EIS measurement circuit has a push-pull converter design.

Still further examples take the form of methods of operating a power system as in any of the preceding examples, and controller configured or adapted for performing such methods in associated with a power system as in any of the preceding examples.

Another illustrative and non-limiting example takes the form of a method of monitoring battery status in a battery electric vehicle, the battery comprising a plurality of battery modules each including at least one battery, the method comprising: taking first energy from a first battery module to provide excitation current for performing an electrochemical impedance spectroscopy (EIS) test on a second battery module; synchronously measuring battery voltage and current in the second battery module in the EIS test; and returning second energy to the first battery module, the second energy approximating the first energy.

Additionally or alternatively, the battery electric vehicle includes an EIS circuit comprising a transformer for transferring energy from the first battery module to the second battery module.

Another illustrative and non-limiting example takes the form of an electrical architecture for measuring impedance of cells in a battery system using electrochemical impedance spectroscopy (EIS) comprising: first, second and third inputs coupled to first and second battery circuits each having at least one battery, with the first and second inputs coupled to the first battery circuit, and the second and third inputs coupled to the second battery circuit, such that the second input is common to the first battery circuit and the second battery circuit; first and second switches; a transformer having first and second primary side nodes, and first and second secondary side nodes, first and second current sensors; and an EIS controller coupled to the first and second switches and the first and second current sensors; wherein the EIS controller is configured to use the transformer and the first switch to issue a first excitation current to the second battery circuit using power taken from the first battery circuit, the first excitation current being an alternating current having a frequency.

Additionally or alternatively, the EIS controller is configured to use the transformer and the second switch to issue a second excitation current to the first battery circuit using power obtained from the second battery circuit.

Additionally or alternatively, the EIS controller is configured to use the transformer and the first switch to issue a first excitation current to the second battery circuit using power obtained from the first battery circuit by: delivering a series of pulses to the first switch, each pulse closing the first switch to allow a first current to flow from the first battery circuit through the second input and to the first input through the first and second primary side nodes, the first switch, and the first current sensor, such that the transformer causes the first excitation current to flow from the third input to the second input through each of the first and second secondary side nodes and the second current sensor; wherein the first current and the excitation current are each alternating currents approximately 180 degrees out of phase with one another.

Additionally or alternatively, the EIS controller is configured control current amplitude using pulse width modulation to generate the series of pulses by monitoring current flow using at least one of the first and second current sensors.

Additionally or alternatively, the first input is connected to the first primary side node; the second input is coupled to the first switch and the first switch is coupled to the second primary side node; the second input is also coupled to the second secondary side node; and the third input is coupled to the second switch and the second switch is coupled to the first secondary side node.

Another illustrative example takes the form of a battery management unit (BMU) for first and second battery circuits comprising: a BMU controller in the form of a microcontroller or microprocessor; the electrical architecture of the preceding examples, at least one voltage sensor configured to sense a voltage of at least one of the first battery or second battery; wherein the BMU controller is configured to: issue control signals to the EIS controller to generate the first excitation current and vary the frequency of the first excitation current; receive simultaneous measurements of current from the first and second current sensors and of voltage from the at least one voltage sensor; and calculate impedance of at least one of the first battery or second battery as a function of frequency of the first excitation current.

Still further examples take the form of methods of operating an electrical architecture as in any of the preceding examples, and controller configured or adapted for performing such methods in associated with an electrical architecture as in any of the preceding examples.

This overview is intended to provide an introduction to the subject matter of the present patent application. It is not intended to provide an exclusive or exhaustive explanation. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
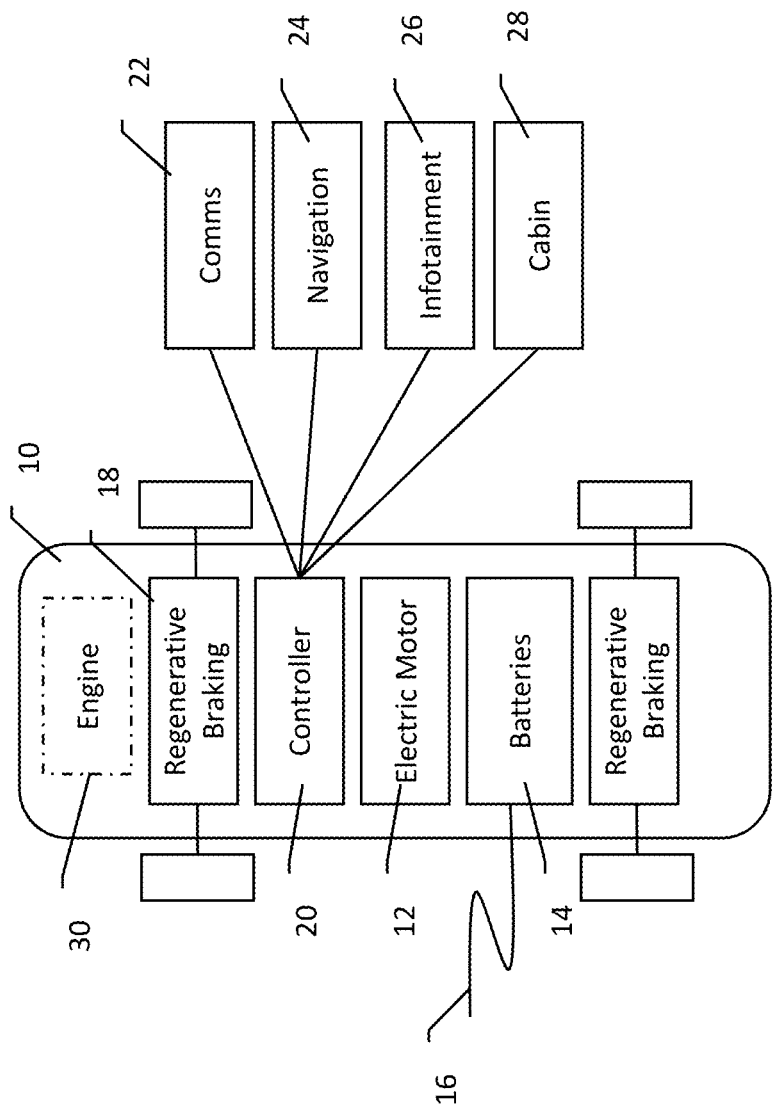
FIG. 1 is a block diagram of a vehicle having an electric drive motor.

FIG. 1 is a block diagram of a vehicle having an electric drive motor. The skilled person will recognize that, for brevity, the following discussion may not necessarily describe every feature that would be present in the vehicle 10. The vehicle 10 is characterized by an electric motor 12 (or plural electric motors 12) that provide motive force to the vehicle 10, powered by batteries 14. The batteries 14 are rechargeable by connection 16 to an off-vehicle electricity source, as is known in the art, and may have any suitable chemistry. Batteries 14 may be associated with various secondary features, such as warming and/or cooling apparatuses to maintain suitable temperatures therein. Regenerative braking 18 may be provided, and serves to at least partly recharge the batteries 14 under suitable braking conditions.

A controller 20 is coupled to each of these blocks, and may further be linked to control blocks for communications 22, navigation 24, infotainment 26, and cabin 28. The controller 20 is configured for sending and receiving information as well as to provide and/or control power used by, for example, an air conditioning unit used for cooling the cabin 28, or other environmental controls for the cabin 28. The communications 22 may include any of satellite, cellular, Bluetooth, broadband, WiFi, and/or various other wireless communications circuits, antennae, receivers, transceivers, transmitters, etc., as desired. The communications 22 may allow the controller 20 to send and receive data relative to one or more internet, dedicated, and/or cloud-based data receiving and/or processing centers, such as a fleet monitor. The communications 22 may be used to upload and/or download data of various types.

The navigation system 24 may store, retrieve, receive, and/or display various types of data including, for example and without limitation, weather/environmental data, road data including curvature, posted speed limits, and grade, as well as traffic data, as desired. The navigation system 24 may also be used to provide route instructions to a driver of the vehicle, and/or to provide a route for an autonomous drive controller to use. The navigation system 24 may include a global positioning system (GPS) device for determining and tracking position of the vehicle 10.

Several examples that follow focus on the batteries 14 and associated systems. While these examples may be mostly used in the context of an electric vehicle (EV) lacking another source of power, the present innovation may also be used in hybrid vehicles having a second power source, such as an internal combustion engine 30, or a fuel cell or other power source onboard. More pertinent than the choice of multiple power sources is the fact that the vehicle 10 includes a plurality of batteries 16 of size and capacity that will allow motive power to be generated by the electric motor 12. While vehicle having wheels is illustrated, it should also be understood that the present invention may be used in aviation as well as in fixed installations having rechargeable batteries 14 in which reduced cost and relatively low power options for monitoring the status of the batteries 14 is desired.

Figure 2:
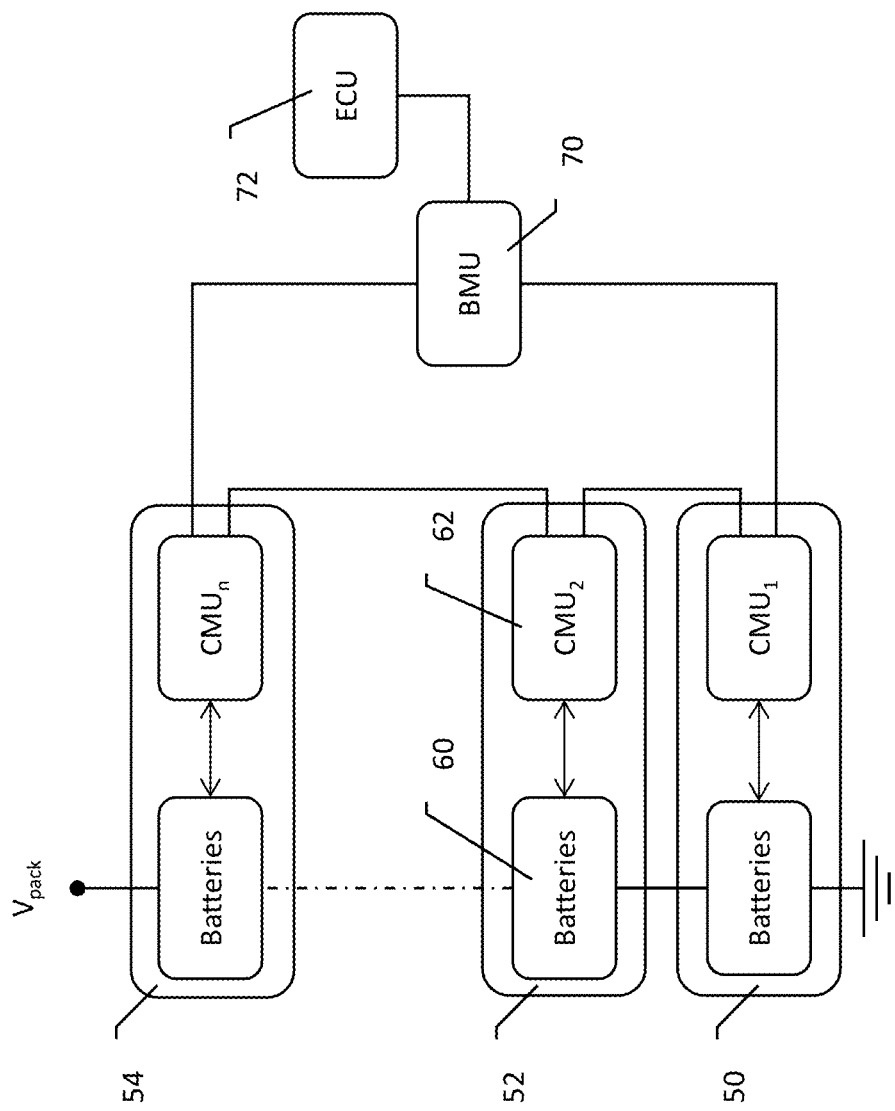
FIG. 2 is a block diagram of an illustrative battery architecture.

FIG. 2 is a block diagram of an illustrative battery architecture. The battery pack includes a plurality of modules 50, 52, 54, each having a set of batteries 60 and a cell management unit (CMU) 62. The batteries 60 in each module 50, 52, 54 may include a collection of cells in series and in parallel. The CMU 62 has circuitry and sensors for cell voltage measurement, temperature measurements and cell balancing, and is configured to monitor the cells and keep the module 52 in a safe operating region. Cell voltage may be sampled several times a second, for example, ten to one hundred times a second. Surface temperature may be sampled less frequently, for example, one to ten times a second, as temperature changes more slowly. A typical installation may have one temperature sensor for every two cells. Current flow may be monitored at the pack level in some systems.

Data gathered by the CMU 62 is communicated, such as via wire or wireless, to a battery management unit (BMU) 70. For example, some systems may have a controller area network (CAN) bus; other communications designs and modes may also or alternatively be used. The BMU performs various estimations of battery and pack status, and sends commands to each CMU for actions such as cell balancing, cell voltage and temperature reporting. For example, state of charge (SOC) may be estimated using the battery voltage measurements and/or current monitoring. State of health (SOH) may be estimated using one or more of the internal resistances of the battery/battery cells, as well as data related to the amount of charge that can be held in the batteries, which will drop over time, and is determined using known methods such as tracking current flows into and out of the battery while also monitoring SOC based on cell voltage measurements. State of power (SOP) may be estimated and represents the instantaneous power output capability of the battery, which will relate to the SOC and the internal resistance, among other factors.

The BMU 70 may also communicate to heating and/or cooling systems associated with the battery pack to ensure safe and efficient operation. The BMU 70 in turn communicates to an electric control unit (ECU) 72 that operates at the vehicle level to make decisions and issue commands to the rest of the vehicle, as well as providing alerts to the driver/operator of the vehicle as to battery system status when needed.

The CMU 62, BMU 70, and/or ECU 72 may take many forms, including, for example, a microcontroller or microprocessor, coupled to a memory storing readable instructions for performing methods as described herein, as well as providing configuration of the CMU 62, BMU 70, and/or ECU 72 for the various examples that follow. The CMU 62, BMU 70, and/or ECU 72 may include one more application-specific integrated circuits (ASIC) to provide additional or specialized functionality, such as, without limitation a signal processing ASIC that can filter received signals from one or more sensors using digital filtering techniques. Logic circuitry, state machines, and discrete or integrated circuit components may be included as well. The skilled person will recognize many different hardware implementations are available for a CMU 62, BMU 70, and/or ECU 72.

Figure 3:
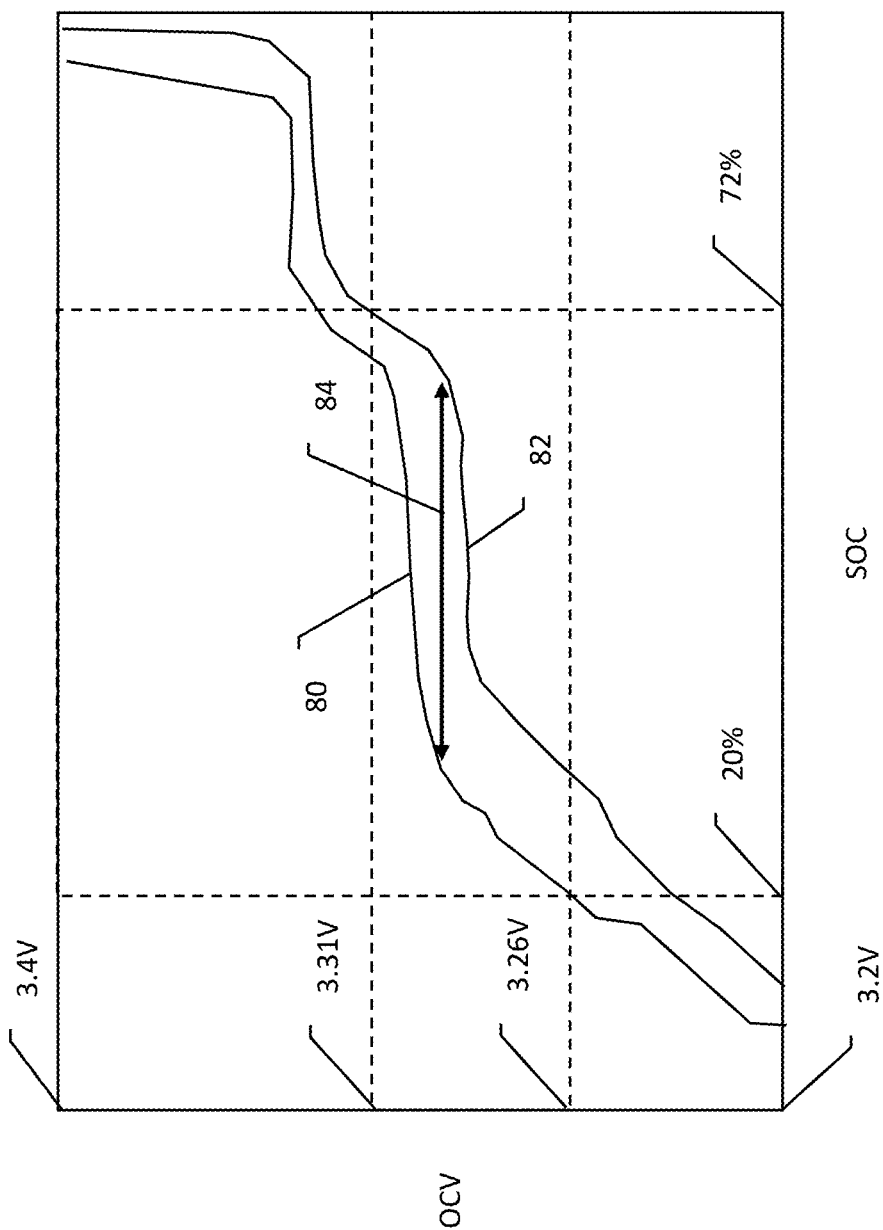
FIG. 3 is a graph of open circuit voltage and state of charge for an LFP cell.

FIG. 3 is a graph of open circuit voltage and state of charge for an LFP cell. The upper line 80 represents the open circuit voltage (OCV) as the battery is charged, after some period of relaxation. In a lab test, the battery is charged from a known state to a given SOC, determined by closely monitoring current flow during charging, and then allowed to relax for minutes or hours to obtain a series of data points/measurements, yielding the OCV charging curve at 80. Likewise, a discharge curve is shown at 82, generated by discharging while closely monitoring current flow from a known starting point. The issue is that, as shown at 84, for a given OCV, the SOC may vary by more than 40%. Using OCV for range estimation can thus introduce a very wide margin of error. Additional ways of cheaply and readily determining the SOC for such cells, with greater reliability, are desired. Coulomb counting is one such method, and additional alternatives are still desirable.

Figure 4:
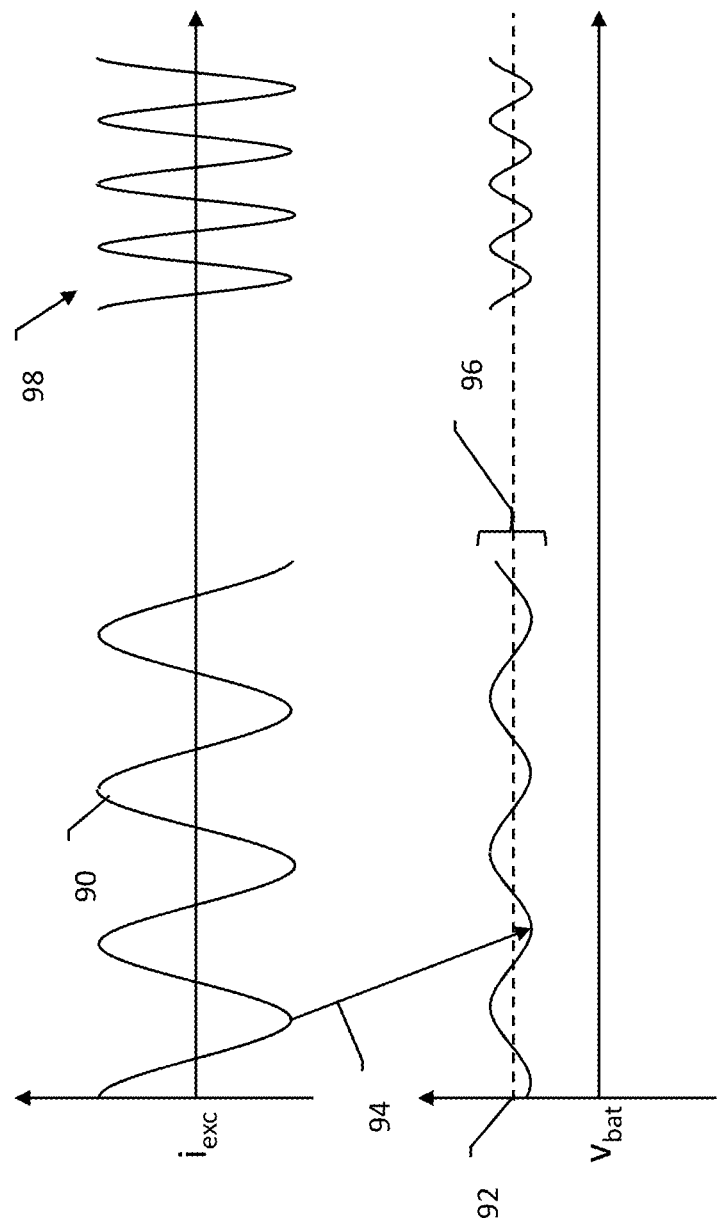
FIG. 4 illustrates current and voltage for EIS.

FIG. 4 illustrates current and voltage for electrochemical impedance spectroscopy (EIS). An excitation current, as shown at 90, is applied to a battery, causing perturbation shown at 92 about the battery OCV 94. The applied signal is an alternating current signal, though not necessarily a sinusoidal signal. As long as the applied signal 90 can be generated in repeatable manner, it can be used. A phase (shift) 94 will also be observed/measured in EIS. The responsive amplitude 96 and phase 94 are measured at a first frequency, and the test is applied again using another frequency, as illustrated at 98. Generally, at least two frequencies are used, though six or more frequencies may be preferred, or a frequency sweep of continuous change across a range may be used.

EIS has typically been limited to use in the laboratory environment, using high grade and expensive equipment. EIS may, for example, be used in failure analysis for EV batteries after such batteries are removed from the vehicle/service. EIS may also be used in processes for analyzing battery designs as part of verification/validation activities and component qualification. However, EIS has not previously been made available in the vehicle itself. EIS can use a potentio-static method, in which a voltage perturbation is applied to a battery cell, and the corresponding current excitation is measured. This is the most widely used technique in laboratory-based EIS, and may be referred to as PEIS. An alternative is a galvanostatic EIS (or GEIS), in which a current perturbation is applied, and the resulting potential is measured. The current perturbation may oscillate around zero amps, so that net current flowing to and from the battery is kept at zero.

Figure 5:
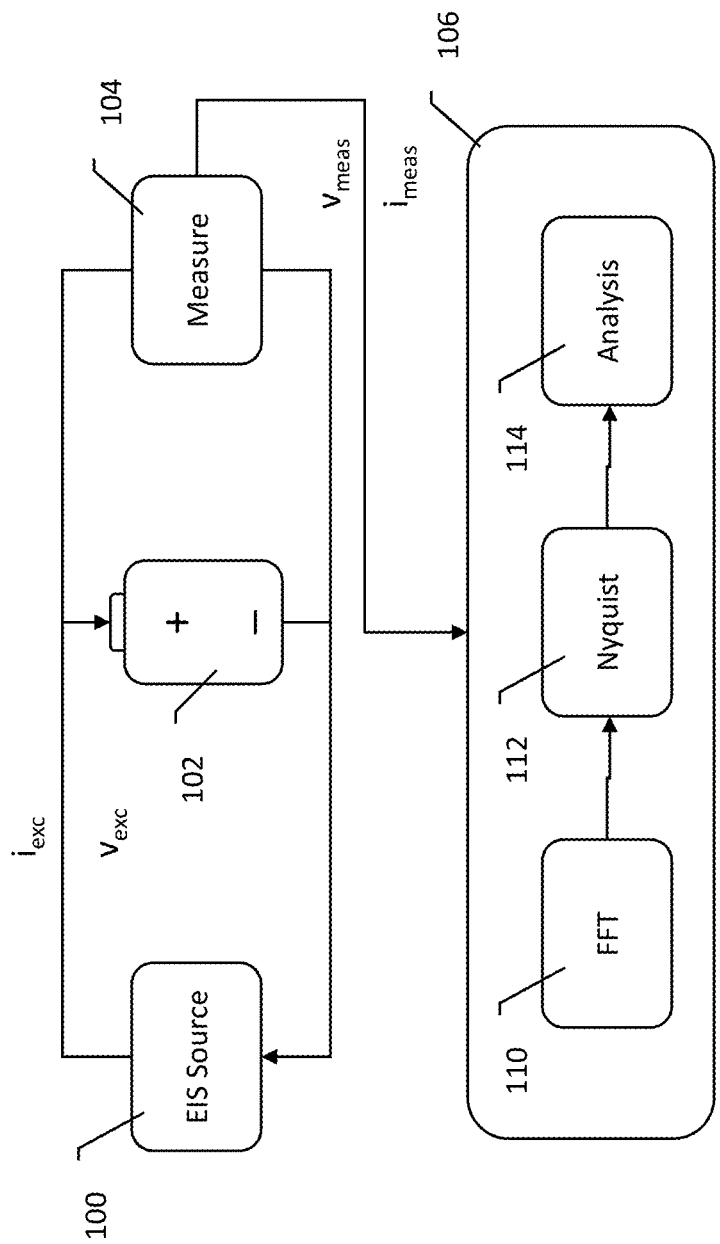
FIG. 5 is a block illustration of an EIS architecture.

FIG. 5 is a block illustration of an EIS architecture. An EIS source 100 provides an excitation signal to a battery 102. If GEIS is performed, the signal is an excitation current, $i_{exe}$. If PEIS is performed, the signal is an excitation voltage $v_{exc}$. The signal applied is an alternating signal, referred to here as an AC current (for alternating current signal) or an AC voltage (for alternating voltage signal). Measurements are performed by block 104. For GEIS, a measured voltage, $v_{meas}$, is obtained; for PEIS, a measured current $i_{meas}$ is obtained. The measurement 104 occurs as the EIS source 100 sweeps through several frequencies or a range of frequencies for the AC signal being generated.

Characteristics of the excitation signal and measured signal are passed to an analysis block 106. A fast Fourier transform (FFT) is performed at 110, and the results populate a Nyquist plot 112 (a parametric plot of a frequency response). In this process, the complex impedance of a cell or set of cells may be calculated from the current and/or voltage measurement across the frequency sweep. The results are analyzed at block 114.

The analysis at block 114 may take several forms. For example, analysis 114 may simply be to compare parameters, FFT results, etc., across a block of similarly situated cells in a cell module to identify any outliers, indicative of possible failure of any outlier cells. If there are no outliers, the cell module may be deemed as operational. Analysis 114 may compare each cell to stored data based on cells from controlled or laboratory testing, to determine whether cells are performing and/or aging appropriately.

Block 114 may instead be used to determine the current state of a cell. For example, as shown in FIG. 3, with at least some battery chemistries, an OCV measurement may correspond to a wide range of possible SOC. At a given OCV, however, a cell's response to EIS may narrow the range of possible SOC, depending on chemistry, for example. For the purpose of determining SOC, controlled laboratory testing may be used to generate data to which the EIS data can be compared in block 114. EIS may be highly useful for this purpose because EIS enables insight into the internal electrochemical processes and allows ohmic resistance, charge transfer resistance and double layer capacitance, among other characteristics, to be at least indirectly observed. If a lithium chemistry is used in the cell, for example, the EIS may also provide an understanding of lithium plating characteristics. A challenge for use in a vehicle is finding ways to perform EIS that are not cost prohibitive or overly power hungry. Other challenges may exist as well, such as whether and/or when to perform EIS, that is, whether unloaded conditions (parked), loaded (driving), or even during battery charging.

Figure 6:
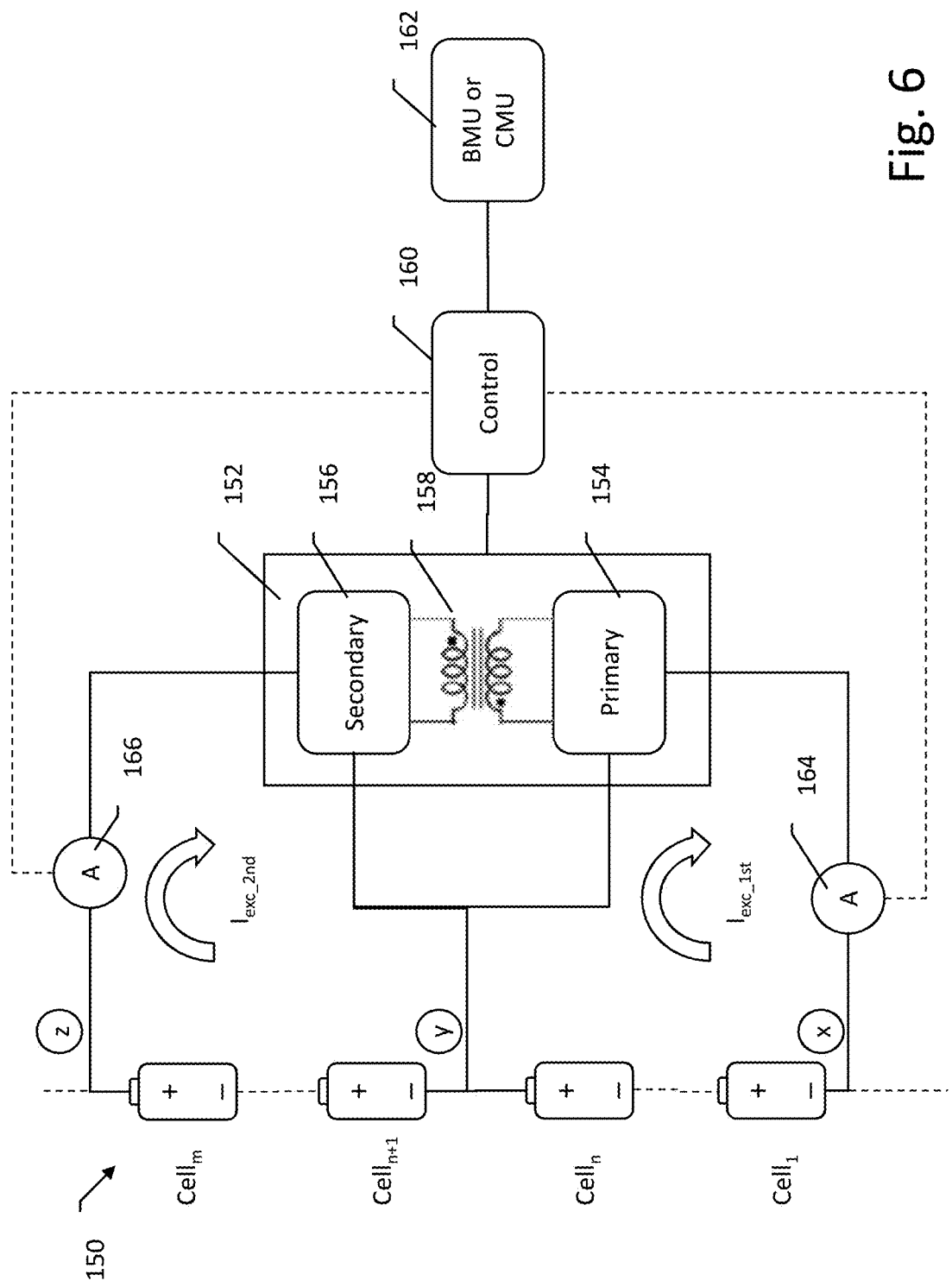
FIG. 6 shows an illustrative on-line EIS circuit.

FIG. 6 shows an illustrative on-line EIS circuit. A series of battery cells are shown at 150, including cells 1 to n, and cells n+1 to m. For example, n may be 10 and m may be 20; the number of cells in each side may be equal, or unequal, as desired. Three inputs to the EIS circuit are thus defined—inputs x and y connect to a first battery circuit shown as cells 1 to n, and inputs y and z connect to a second battery circuit shown as cells n+1 to m. The EIS circuit 152 includes primary side circuitry 154 coupled to inputs x and y, and secondary side circuitry 156 coupled to inputs y and z. The primary side circuitry 154 controls current flow through the primary of a transformer 158, and the secondary side circuitry 156 controls current flow through the secondary side of transformer 158. An overall control block 160 is communicatively linked to a BMU or CMU 162, and also linked to current sensor 164 (in a primary side current loop that is coupled to the first battery circuit, cells 1 to n, as well as the primary side circuitry 154 and the primary coil of the transformer 158) and current sensor 166 (in a secondary side current loop that is coupled to the second battery circuit, cells n+1 to m, as well as the secondary side circuitry 156 and the secondary coil of the transformer 158). The current sensors 164 and 166 are used to measure currents in each loop, current, and may allow closed loop control over excitation current amplitude/magnitude, as desired. Through not shown, each of nodes x, y and z may include a voltage sensor, or there may be voltage sensors at each of the battery cells 150. Also the system may include, as previously indicated, cell temperature measurement sensors as well as cell balancing circuits (active, or more typically, passive), and the communication to the BMU or CMU 162 will be performed with electrical isolation measures in place, as are known in the art.

In operation, the design is to take power from one set of battery cells (initially, those of the primary side current loop, that is, cells 1 to n) and use that power to generate the excitation current applied to the other set of battery cells (initially, those of the secondary side current loop, that is, cells n+1 to m). The circuitry here can be switched as well to then allow the reverse, without needing to stop and dissipate the energy in the circuit, obtaining power from the secondary side current loop, cells n+1 to m, to supply the excitation current for the primary side current loop, cells 1 to n. This configuration minimizes ohmic losses in the circuit to those occurring at the battery cells due to internal impedance, and any stray, parasitic, or conductor resistances encountered. Some minimal heating (loss) will also occur in the transformer 158. In some examples, the quantity of energy transferred from the first group of cells to the second group of cells is approximately equal to the quantity of energy transferred back to the first group of cells, that is, within 90%, or 95%, or 98% in several examples. In some examples shown below, the parts count needed for this system can be quite low, as simple FET switches are used in circuits 154 and 156 with pulse width management (PWM) to control current amplitudes. Other switch types (bipolar junction transistors, etc.) may be used as desired.

In an illustrative example, the EIS measurement system may be designed to excite individual battery cells or sets of battery cells arranged in series or parallel, and provide an excitation current sufficient to cause a cell voltage ripple in the range of about 2 mV to about 5 mV. The current needed would depend on various factors including cell type, capacity and/or quantity, for example. For example, some battery module designs have parallel strings of battery sells, connected together in series, and cell voltage measurement may be performed at the parallel string level. The excitation current may be limited by different operating conditions; for example, excitation current may be reduced when the surface temperature of the battery exceeds a predefined threshold. The range of frequency in some examples may be about 1 Hz to about 800 Hz, with anywhere from three to twenty (or less or more more) test frequencies, for example, ten test frequencies may be used. Synchronized measurement of current and voltage may be a feature as well. The demands of a given battery pack and installation will drive the needed accuracy and/or resolution of any voltage and/or current measurement.

Figure 7:
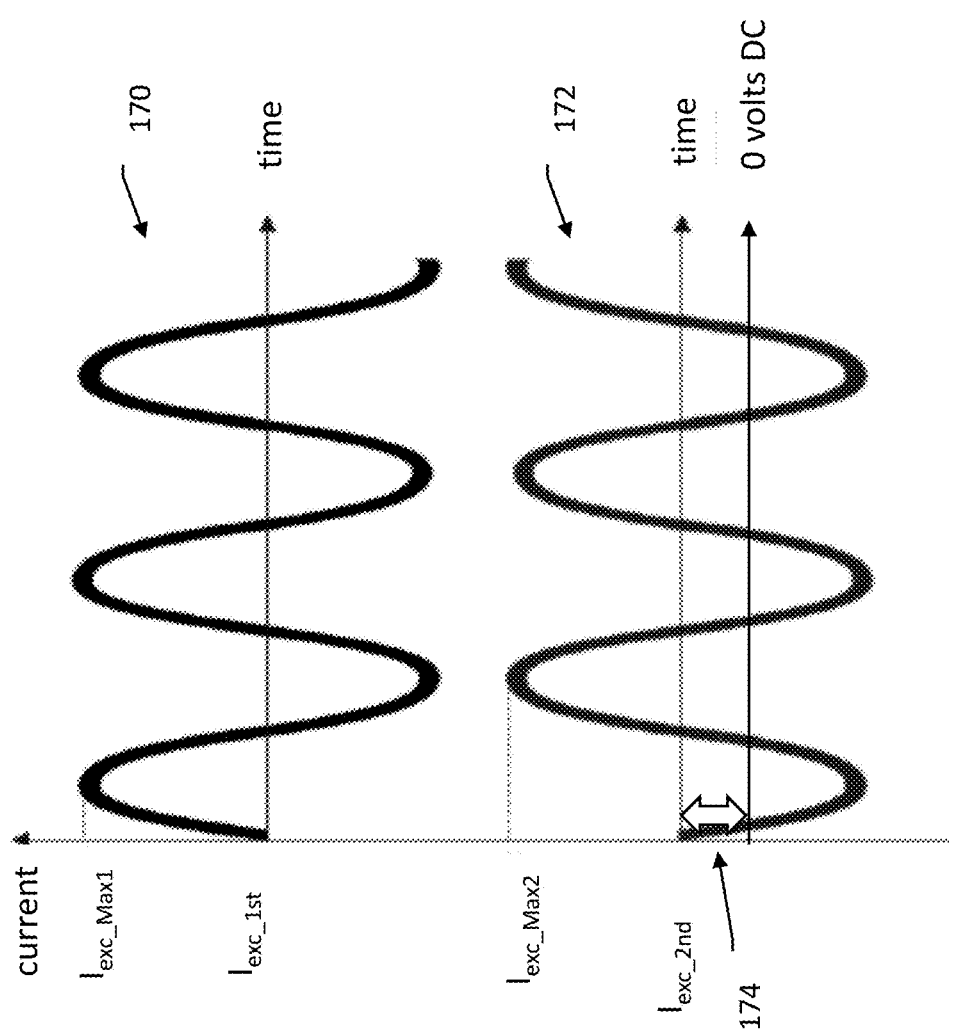
FIG. 7 graphs primary and secondary current in an EIS system.

FIG. 7 graphs primary and secondary current in an EIS system. With the transformer used as shown in FIG. 6, the current drawn from the batteries on the primary side, shown at 170, will be (ideally) 180 degrees out of phase with the excitation current issued to the batteries on the secondary side, as shown at 172. The excitation current may be applied in the presence of a DC offset as shown at 174 due to battery load current. FIG. 7 shows a generally sinusoidal shape; however, this need not be the case. In real world implementation, the current drawn will be approximately 180 degrees out of phase with the excitation current, such as in the range of up to about +/−10 degrees.

Figure 8:
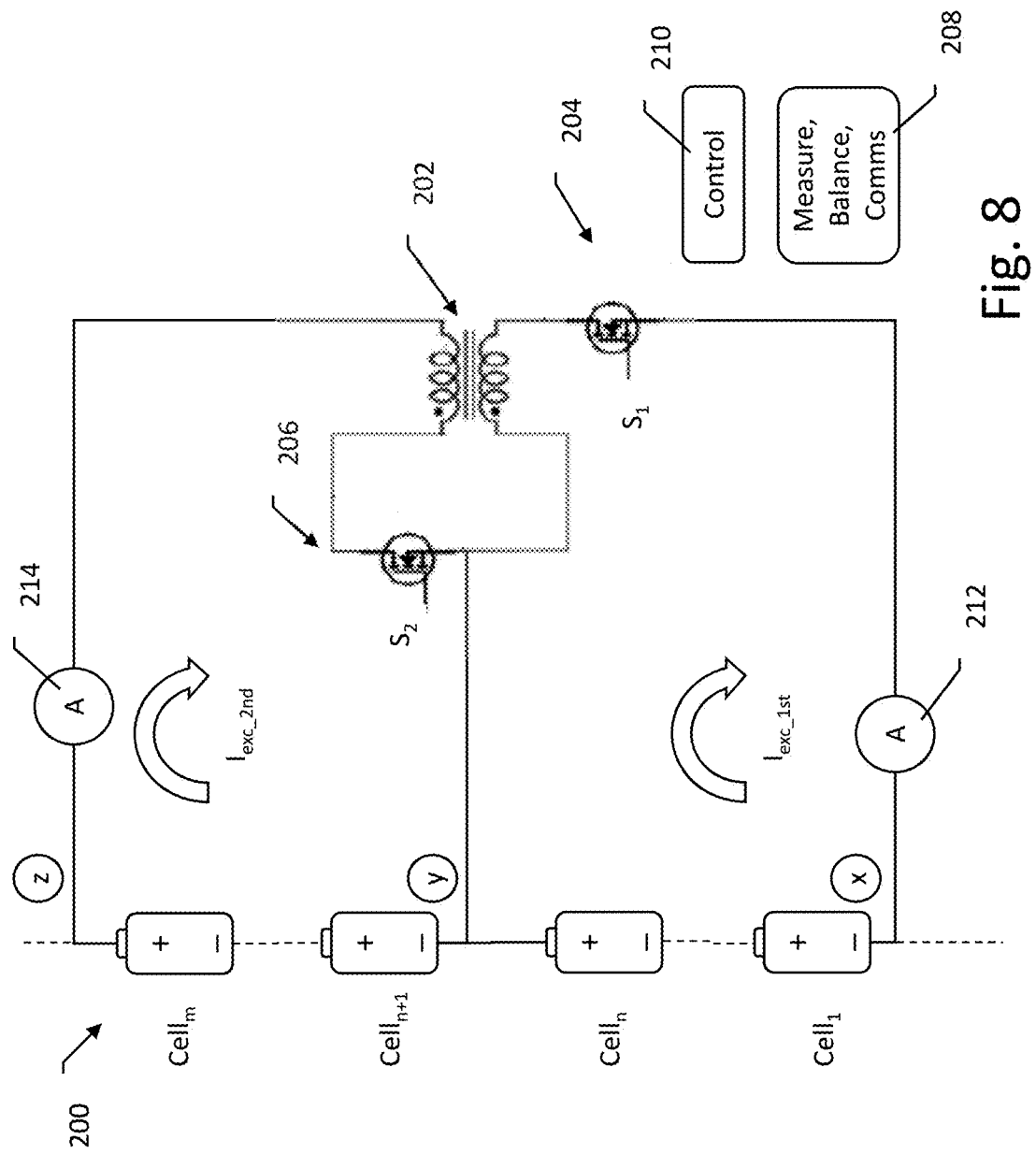
FIGS. 8-10 show illustrative on-line EIS circuits.
Figure 9:
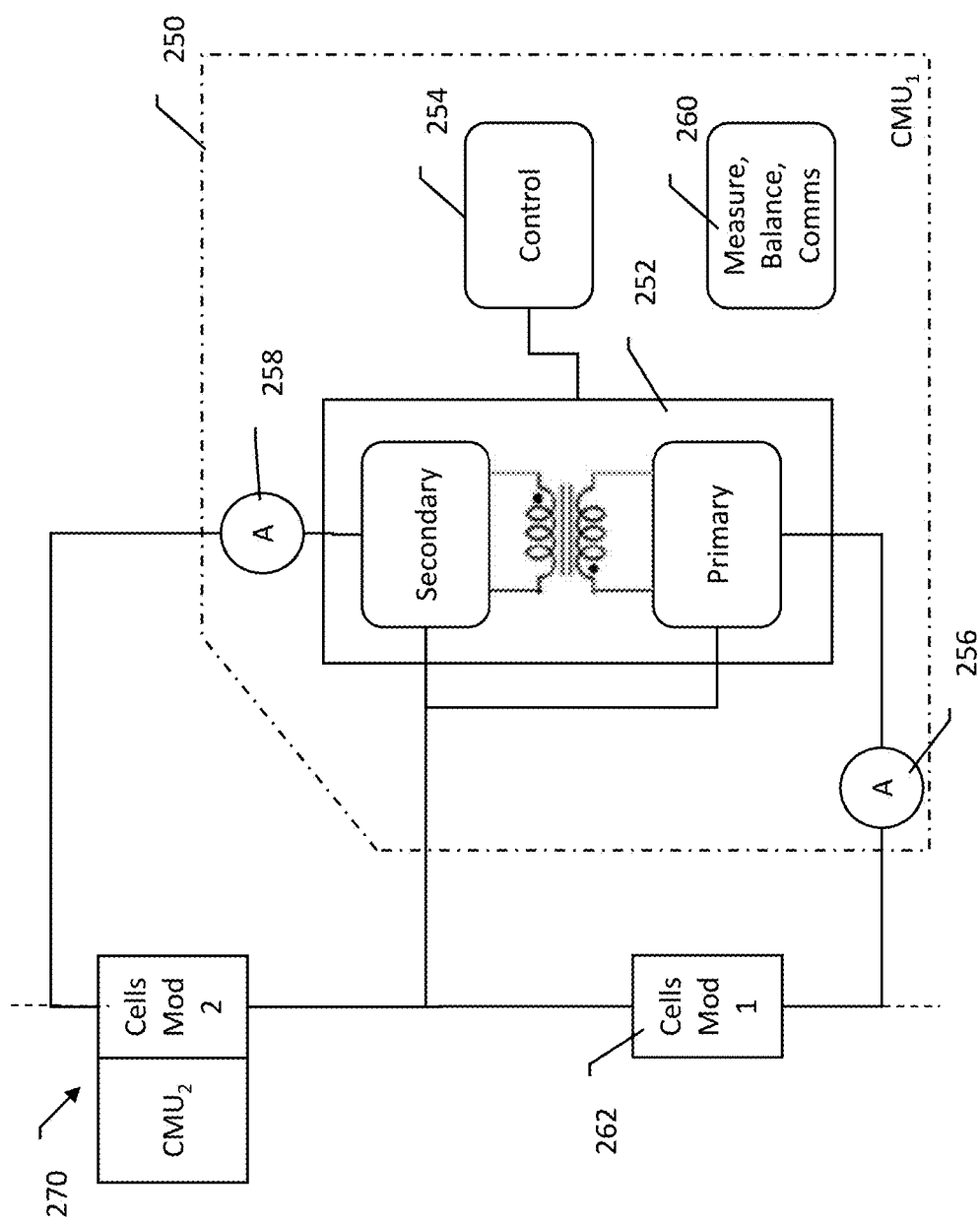
Figure 10:
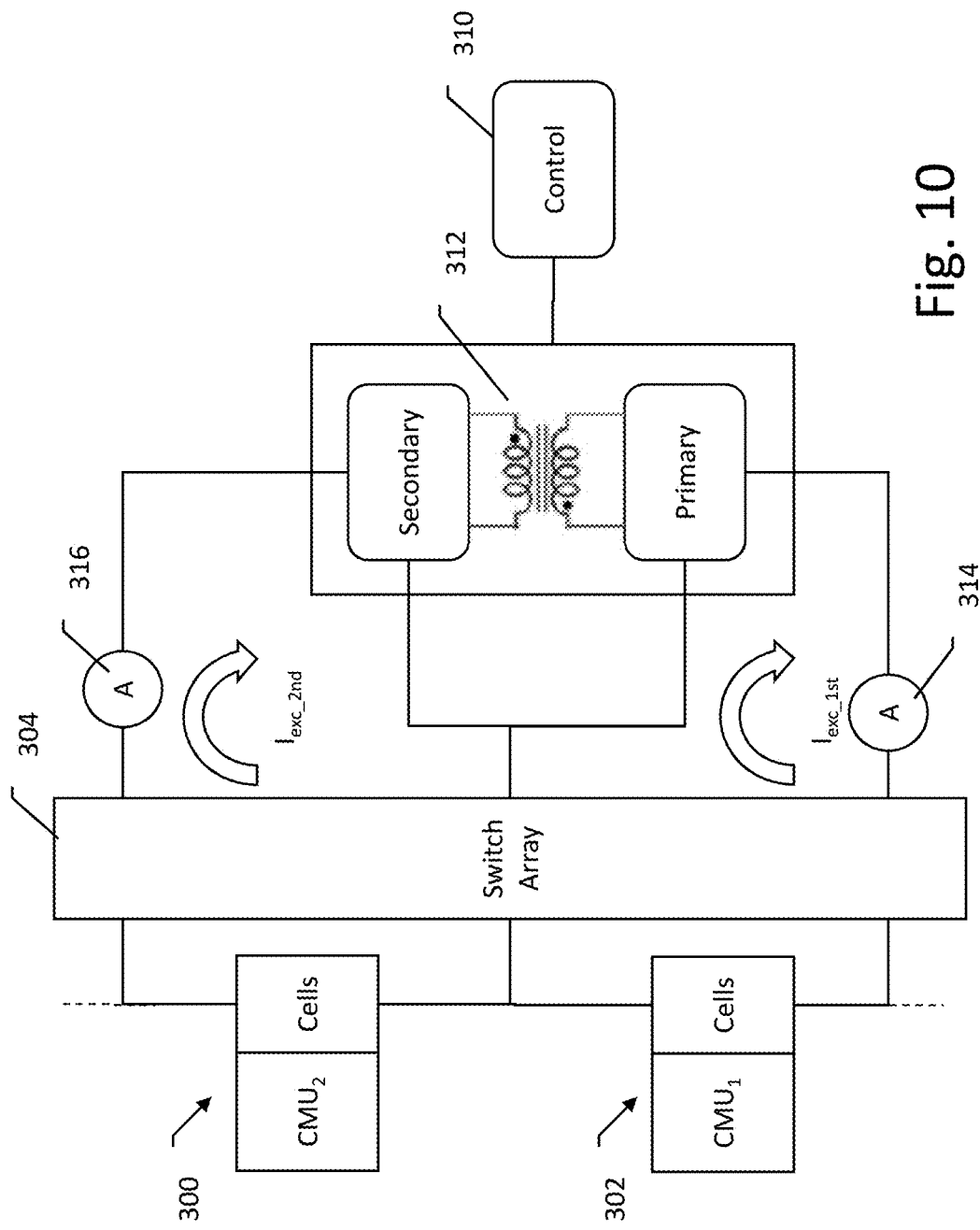
Figure 17A:
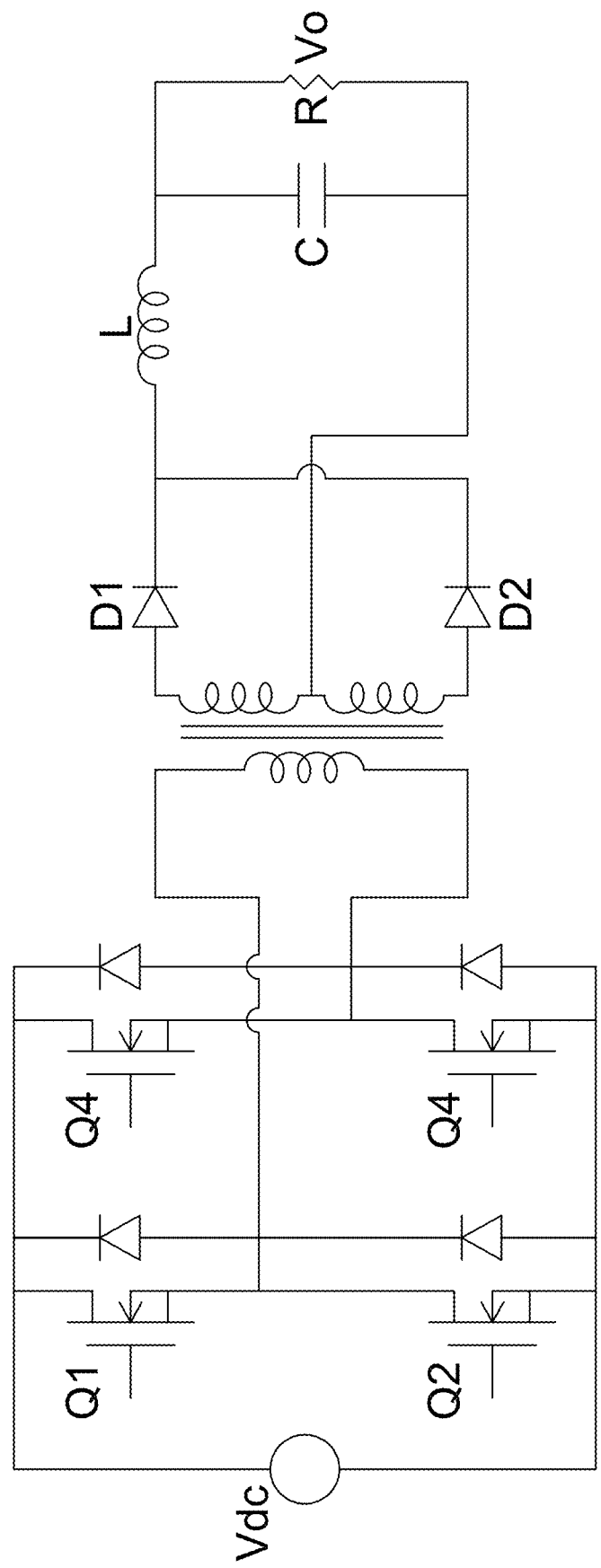
FIGS. 17A-17C show additional EIS excitation signal generator designs.
Figure 17B:
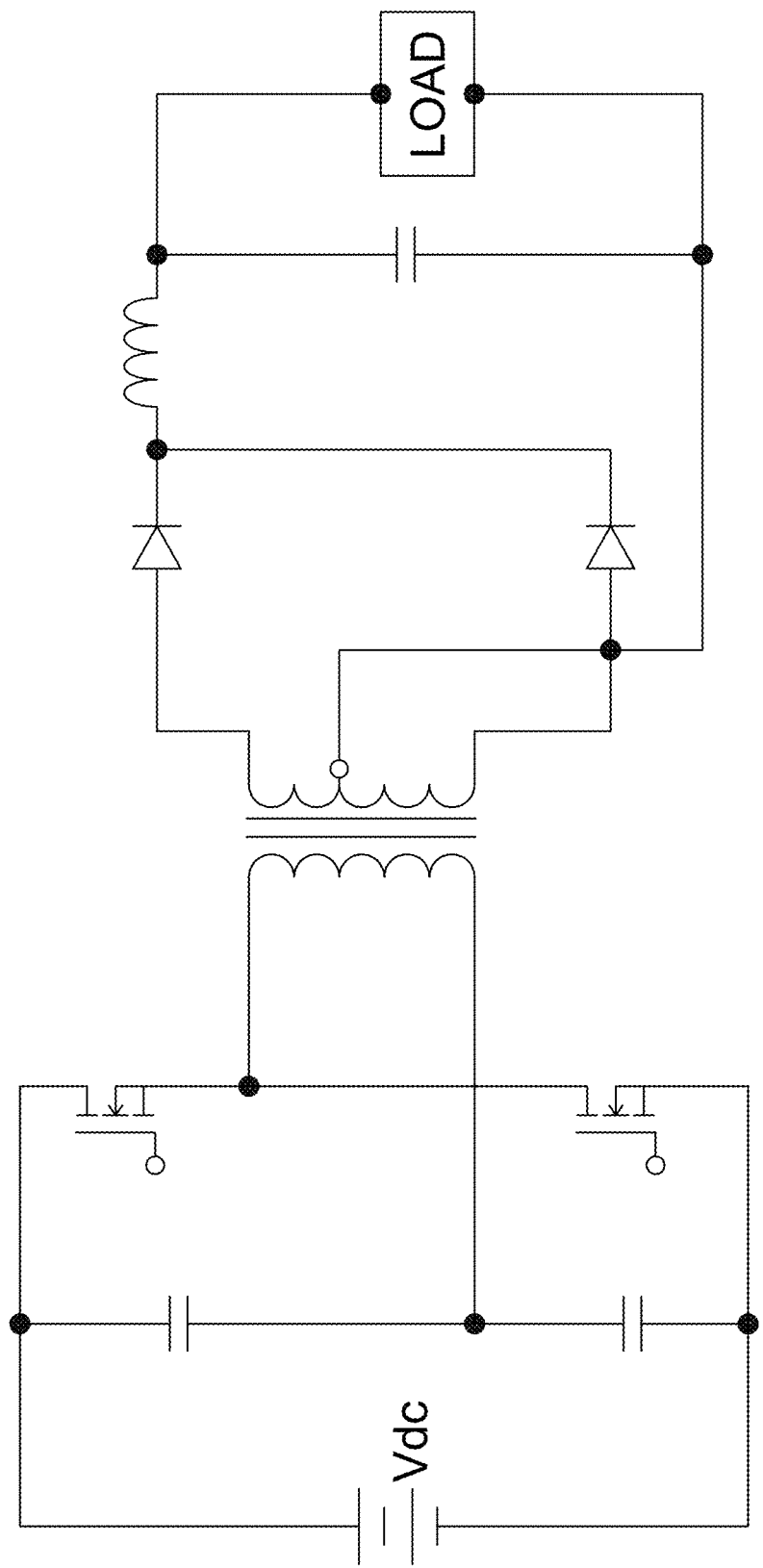
Figure 17C:
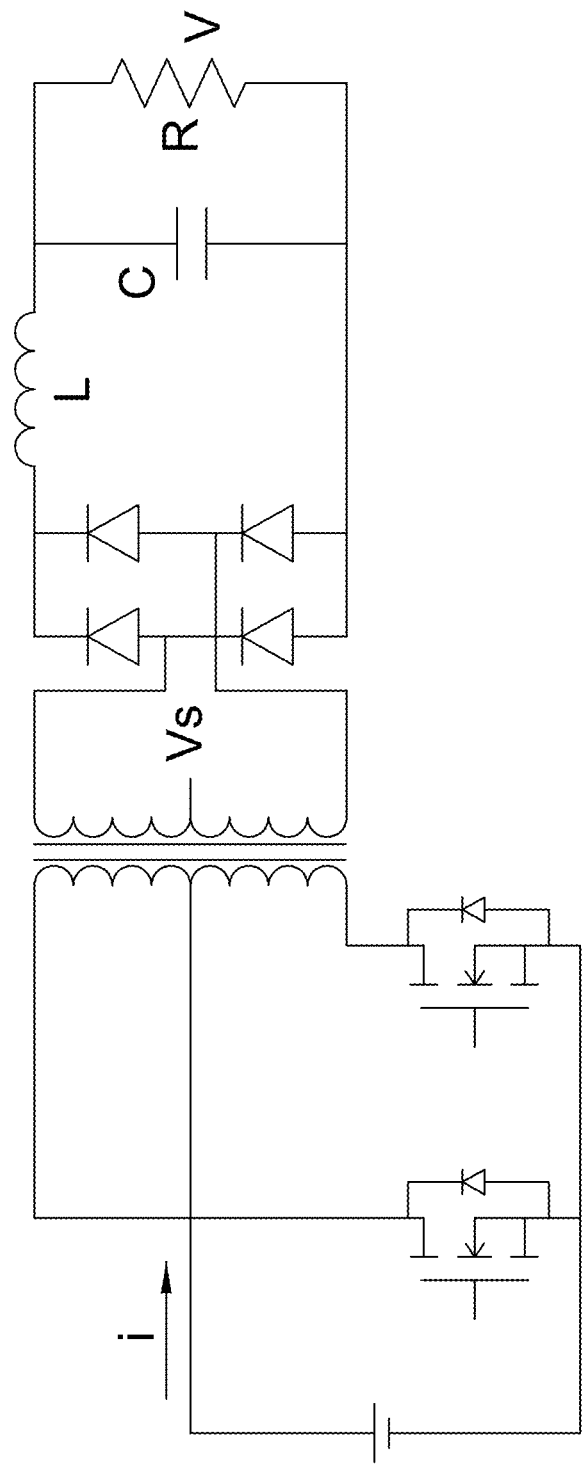

FIGS. 8-10 show illustrative on-line EIS circuits. FIG. 8 provides circuit details for an illustrative example using a flyback converter design; alternative designs may include an isolated full bridge converter, isolated half bridge converter, and a push-pull converter, as shown in FIGS. 17A-17C, below. The flyback topology may provide lower cost but may have limited power capability; half or full bridge topologies may provide greater power capabilities.

In FIG. 8, the cells are shown at 200 coupled to inputs x, y and z. A control block is provided at 210, and other CMU features (voltage and temperature measurement, cell balancing and communications circuitry) are shown in block form at 208. A primary current loop runs from input x through first current sensor 212, to first switch 204, to the primary side of transformer 202, and then to input y. A secondary current loop runs from input y to second switch 206, to the secondary side of transformer 202, to second current sensor 214, to input z.

The control block 210 provides an input to switch S1 of the first switch 204, closing switch S1, allowing current to flow through the first current loop. The primary side current flow at transformer 202 induces current to flow on the secondary current loop. Pulse width modulation (PWM) of the signal to switch S1 is used to control the current amplitude. Repeated application of pulses to switch S1 induces current at a frequency determined by the repetition rate of the applied pulses. Pulses are applied in alternating fashion between switch S1 and switch S2 in an illustrative example, allowing full wave alternating current (AC) signal to be issued.

The shape is not necessarily sinusoidal, but the shape of the AC signal is unimportant as long as the signal is repeatably generated in a reliable manner. It is desirable that voltage and current measurements be available with relatively small skew. As the skilled artisan would recognize, this topology uses power taken from a first battery circuit (cells 1 to n) to create an excitation current for the second battery circuit (cells n+1 to m) when switch S1 is closed and does the opposite when switch S2 is closed.

FIG. 9 illustrates how the topology can be configured in a modified CMU and standard CMU context. Here, a first battery module 262 is associated with the special purpose or modified $CMU_1$, at 250, which includes the EIS circuitry at 252 and associated control circuit 254, as well as current sensors 256 and 258. A connector couples the second current meter 258 to the output of a second battery module shown at 270, having a standard CMU which lacks EIS circuitry in some examples. The EIS circuit in $CMU_1$ can thus be used to analyze two cell modules 262, 270. Other standard CMU elements are noted at 260 in $CMU_1$. With the topology shown, then, half of the CMUs in the system may include EIS circuitry, while the remainder can omit EIS circuitry, reducing overall cost.

FIG. 10 shows another approach. Here, standard battery cells modules are shown at 300, 302. A switch array 304 (such as an IC in the form of a multiplexor, if desired) is used to connect an EIS circuit shown at 312, having control circuit 310, to selected ones of the modules 300, 302. For example, there may be any number of modules 300, 302. Depending on how often it is desired to run EIS on the battery modules, there may be as few as one EIS circuit 312 in a battery pack, or as many as are desired. There may be additional power losses due to the need for longer connecting wires and the switch array with this arrangement, offset by savings (both space and cost) associated with not having to include the EIS circuit in half of the CMUs. In the following methods, whenever a CMU is indicated as performing a step in the EIS method, the controller 310 may instead perform that step if a topology as shown in FIG. 10 is used rather than a modified CMU having EIS circuitry therein.

Figure 11:
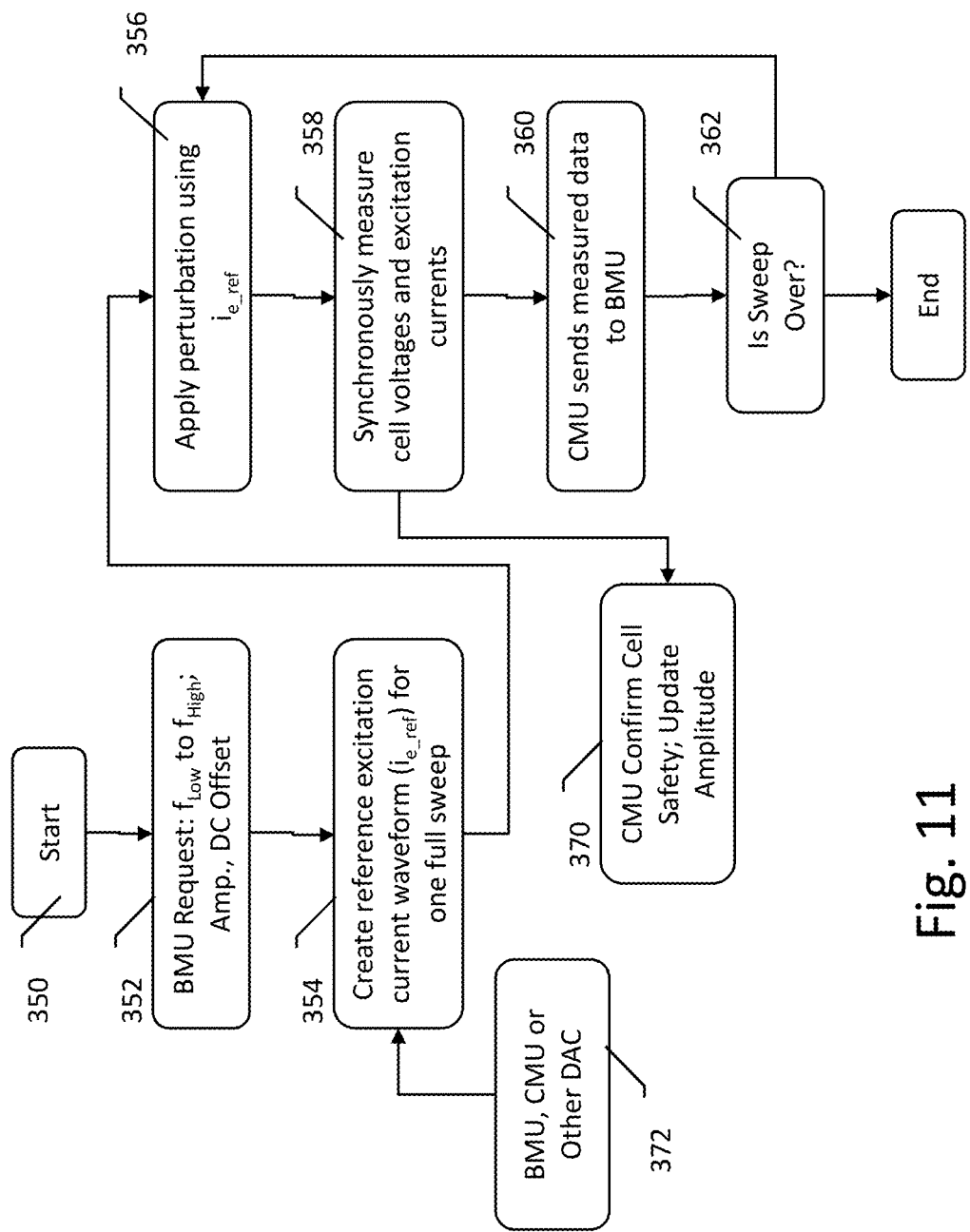
FIG. 11 is a block flow diagram of an illustrative method.

FIG. 11 is a block flow diagram of an illustrative method, focused on the operations at the CMU. From start block 350, the method has the BMU request an EIS analysis on two battery sub-circuits each having at least one battery therein. The BMU request may identify frequency range from $f_{low}$ to $f_{high}$, a duration or quantity of cycles at each frequency (1, 2, . . . n; more cycles require more time but may provide greater accuracy and more data), a number of frequency data points to use, an amplitude (max amplitude) and/or DC offset to be used, as indicated at 352.

The BMU, or the CMU, may create a reference excitation current $i_{e\_ref}$ for use in the frequency sweep, as indicated at 354 (a step further illustrated below in FIGS. 12 and/or 16). The perturbation is then applied by using the reference excitation current $i_{e\_ref}$ as a control input, as indicated at 356. The CMU performs synchronized measurement of cell voltages and excitation currents, as indicated at 358, and sends the measured data to the BMU, as indicated at 360. If the sweep is not yet complete, block 362 sends the method back to 356, and the perturbation is applied further. Once the sweep is over, the method ends. Throughout the process, the CMU uses the measured data from block 358 to confirm that cells are being used within safety limits; if needed, the perturbation amplitude may be modified, such as by reducing the amplitude if cell temperature increases or if cell voltages are out of range. The reference current, as indicated at 372, may be generated by the BMU, by the CMU, or by a separate circuit, any of which may use a digital to analog converter (DAC) to create the reference current.

Figure 12:
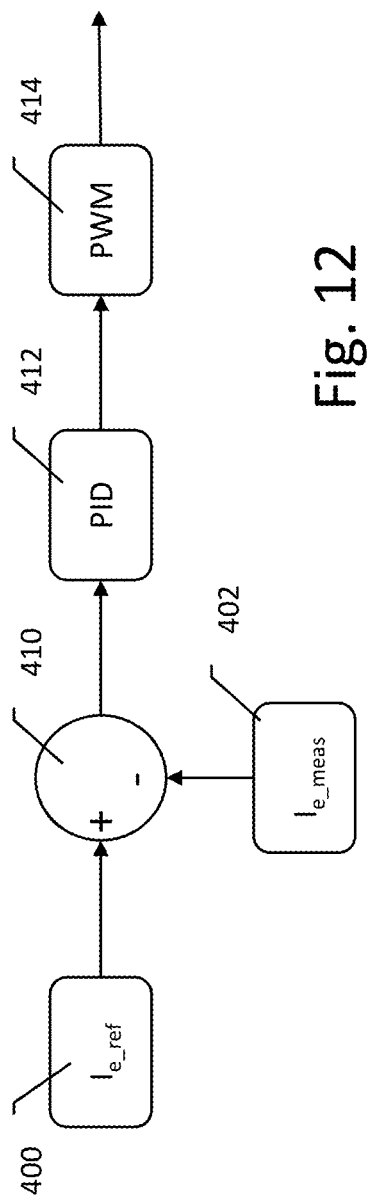
FIG. 12 shows an illustrative EIS excitation signal generator control.

FIG. 12 shows an illustrative EIS excitation signal generator. The reference excitation current $i_{e\_ref}$ to be used is received at 400 and a differentiator is used at 410 to compare to a measured excitation $i_{e\_meas}$ current 402. Any difference is operated on in a proportional-integral-differential (PID) control block 412, which modifies the pulse width modulation (PWM) as indicated at 414.

Figure 13:
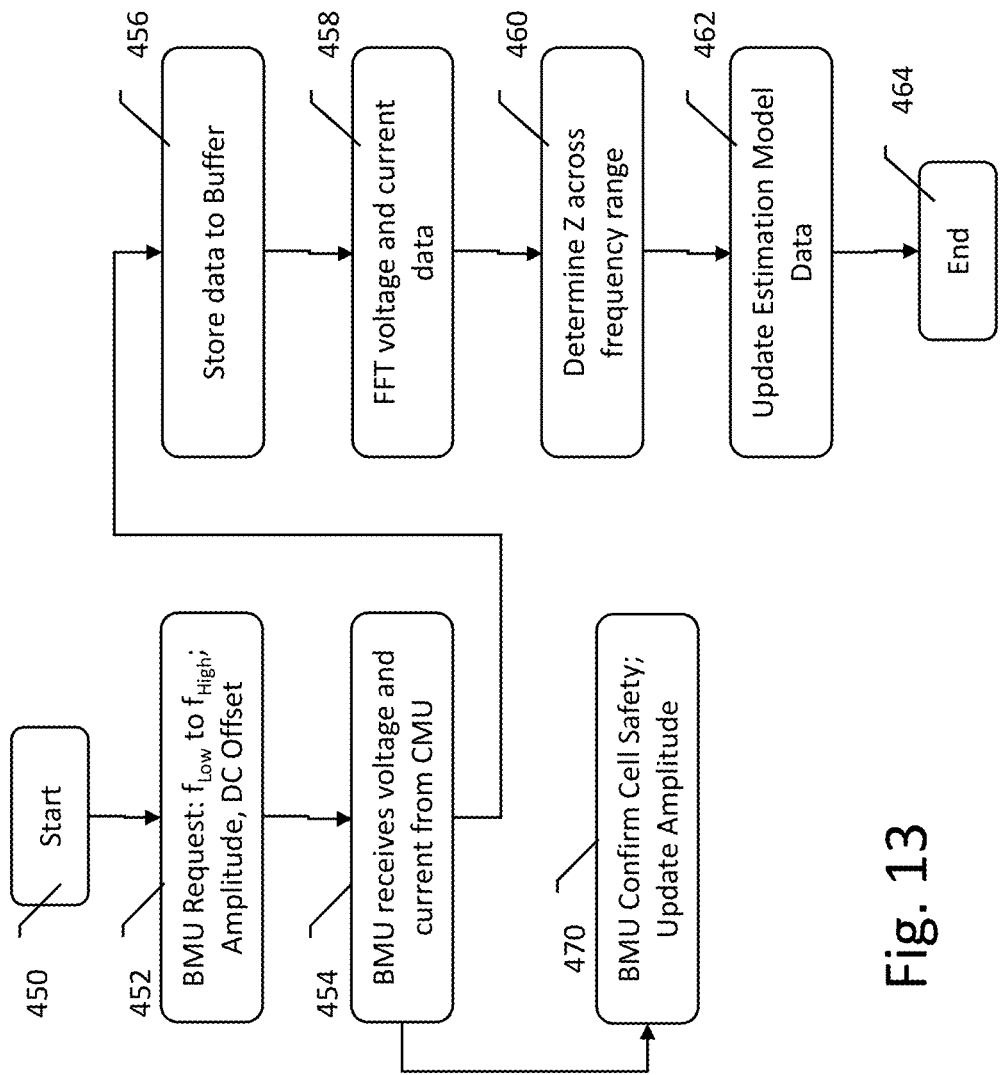
FIGS. 13, 14A-14B and 15 are block flow diagrams of illustrative methods.

FIGS. 13, 14A-14B and 15 are block flow diagrams of illustrative methods. FIG. 13 highlights the BMU operations. From start block 450, the BMU issues its request at 452, specifying in this example, frequency range from $f_{low}$ to $f_{high}$, a number of frequency data points to use, an amplitude (max amplitude) and/or DC offset to be used, as indicated at 452. As the EIS is performed, the BMU receives voltage and current data from the CMU, as indicated at 454, and stores the received data in a buffer 456 or other memory. An FFT is then performed on the voltage and/or current data as indicated at 458, and impedance (Z) across the frequency range is calculated at 460. Block 460 may determine the complex impedance, including both real and imaginary impedance. The estimation model data for battery cell status can then be updated, as indicated at 462, reflecting, for example, changes in battery health, capacity, etc. Block 462 may additionally or alternatively include determining the SOC of battery cells. The method can then end at 464. Optionally, as indicated at 470, the BMU may also perform analysis to confirm that cells are being used within safety limits; if needed, perturbation amplitude may be modified, such as by reducing it, if cell temperature increases or if cell voltages are above or below desired limits.

Figure 14A:
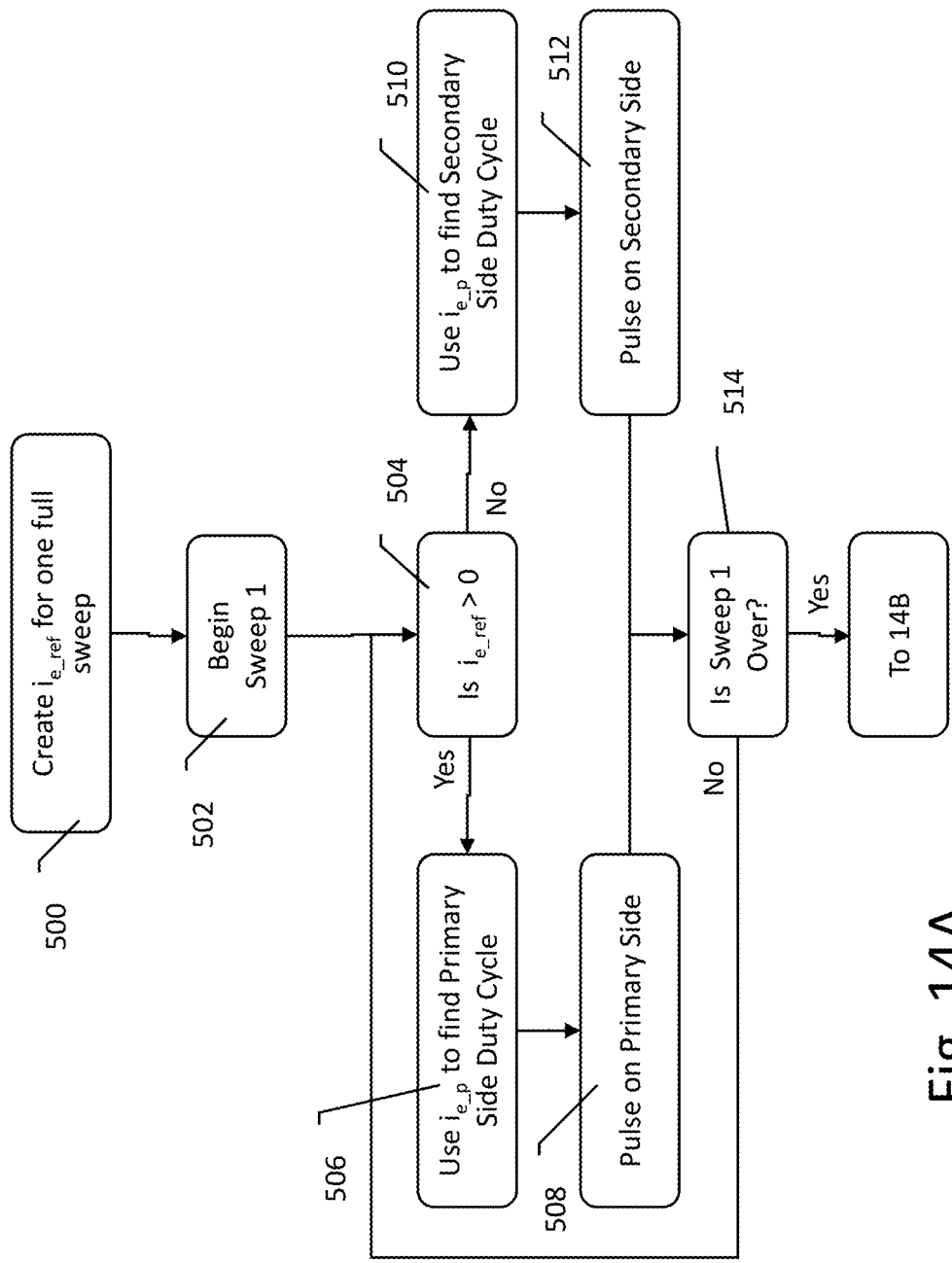
Figure 14B:
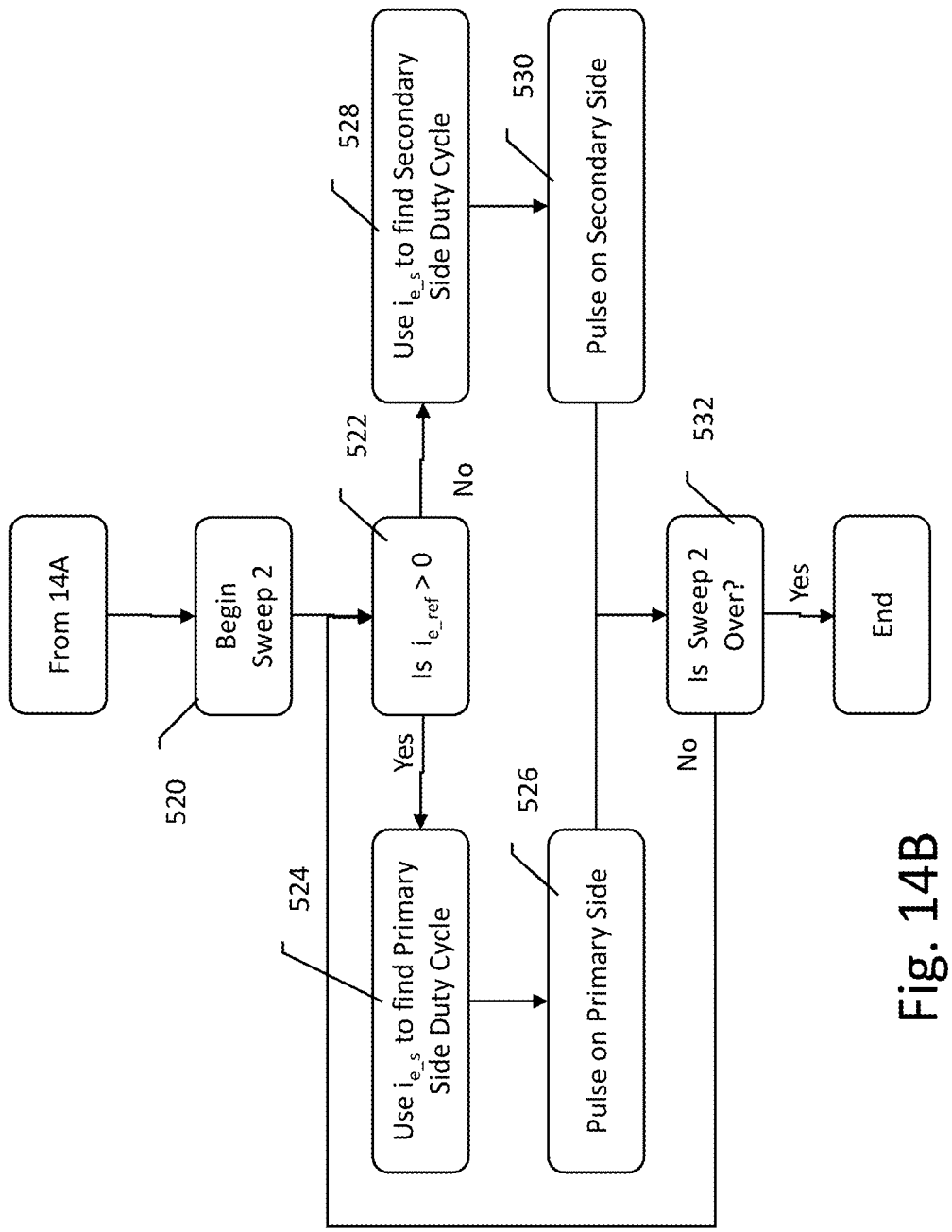

FIGS. 14A-14B focus on the control method for a circuit as shown in FIG. 8. At block 500, reference excitation current $i_{e\_ref}$ to be used is created, using, for example, a DAC. The first sweep begins at 502. During the first sweep, a full wave output is generated by determining in each time instance whether the reference current is greater than zero, as indicated at 504. If so, the primary side current is used at 506 to determine the primary side duty cycle or pulse width, and a pulse is delivered to the switch on the primary side at 508. If the reference current is negative at 504, the primary side current is used to determine the secondary side duty cycle, as indicated at 510, and a pulse is delivered to the switch on the secondary side at 512. Referring back to FIG. 8, the pulse from block 508 would be delivered to switch S1; conversely, the pulse from bock 512 would be delivered to switch S2. The current indicated in block 506 would come from the primary side of FIG. 8, that is, current sensor 212. The method loops back from block 514 to block 504 until the first sweep is over. Once the first sweep is completed, the method proceeds to FIG. 14B.

In the preceding paragraph, the switching outputs are issued at a frequency that preferably exceeds the maximum frequency to use for current excitation by a significant amount. For example, a 100 kHz switching frequency may be used, thus the repetition rate for the method may occur at a period of 10 us; higher or lower switching frequency and repetition rate may be used, as desired. At 100 kHz switching frequency, the frequency of excitation can easily be handled up to about 1 kHz, though the signal may be distorted to greater degrees as the excitation frequency is further increased.

In FIG. 14B, the second sweep begins. Here the second sweep begins at 520, again with analysis of whether the reference current is positive or negative at block 522. If the reference current is positive, the current sensed on the secondary side (referring to FIG. 8, current as measured at current sensor 214) is used to determine the duty cycle to apply on the primary side at block 524, and a pulse is issued to the primary side at block 526 (referring to FIG. 8, the pulse would be issued to switch S1). If the reference current is not greater than zero, the current sensed on the secondary side (again current sensor 214 of FIG. 8) is used to determine duty cycle/pulse width at 528, and a pulse is issued to the secondary side at block 530 (to switch S2 of FIG. 8). Block 532 iterates the method back to block 522 until the second sweep is completed, and the method ends.

Figure 15:
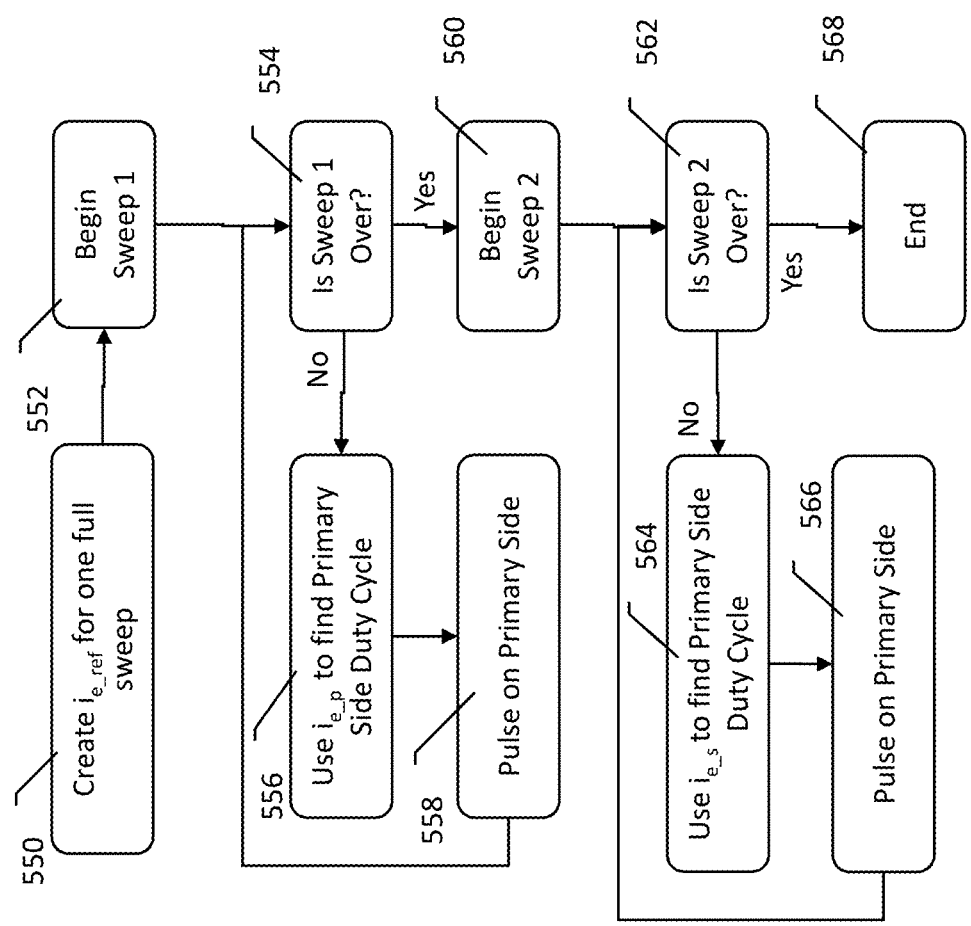

In FIGS. 14A and 14B, the comparison of the reference current to zero at blocks 504 and 522 is performed by first adding any desired DC offset/bias to the reference current value for a given point in time. This will allow the BMU-requested DC bias to be implemented at the EIS system. If the DC offset is larger than the maximum AC current, then the method becomes simpler as shown in FIG. 15. In FIG. 15, the comparison steps are eliminated. Now, the reference current is created for the full sweep as indicated at 550, and a first sweep begins at 552. While the first sweep is ongoing, block 554 directs the method to block 556, where the sensed primary side current is used to determine the primary side duty cycle at 556, and a pulse is delivered on the primary side at 558. Once the first sweep ends at block 554, the second sweep begins at 560. While the second sweep is ongoing, block 562 directs the method to block 564, where the sensed current on the secondary side is used to determine the secondary side duty cycle. The pulse is then delivered on the primary side as indicated at 566.

In FIGS. 14A, 14B and 15, the first sweep each time is one in which primary side current is monitored and compared to the reference current to determine pulse width/duty cycle for the switch being actuated by the control circuitry. By so doing, the excitation current is being generated on the primary side, but used to create a current perturbation on the secondary side, where the current is not being measured for control purposes. This means that the batteries coupled to the secondary current loop are the ones under test. Conversely, the batteries coupled to the primary current loop are the ones under test during the secondary sweeps.

While it would potentially be easier to use an open loop control strategy and sinusoidal pulse width modulation, the open loop nature does not allow tracking of the excitation current to tightly control limits. As a result, margin would need to be built into the system to prevent overvoltage or overcurrent issues from arising. The closed loop control as shown in the above provides somewhat better control.

Figure 16:
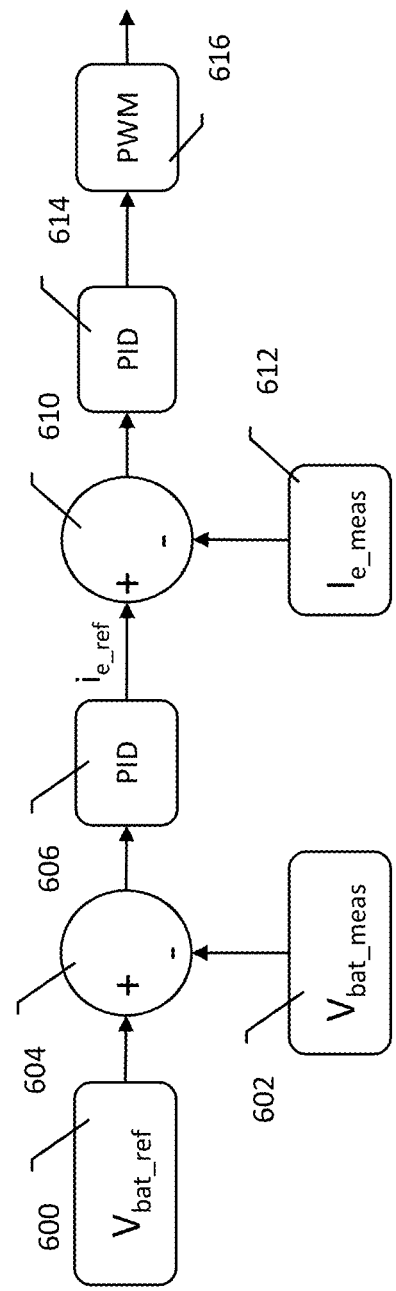
FIG. 16 shows another illustrative EIS excitation signal generator control.

FIG. 16 shows another illustrative EIS excitation signal generator. The above disclosed architecture, including that of FIG. 8, may be used here to issue a PEIS (voltage controlled) perturbation. A reference battery voltage is generated and input to the control method, as indicated 600. The measured battery voltage 602, which may be a filtered version (such as a bandpass or lowpass filtered battery voltage) is compared to the reference voltage at 604. The difference is operated on using PID control strategy as indicated at 606, and a current reference is then generated. The measured current 612 is compared to the current reference at 610, and PID control is again used at 614 to determine the pulse width modulation at 616.

FIGS. 17A-17C show illustrative alternatives to the flyback topology of FIG. 8, each in isolation. FIG. 17A shows an isolated full bridge converter. FIG. 17B shows an isolated half bridge converter topology. FIG. 17C shows a push-pull converter topology. Each may be used in place of the flyback topology of FIG. 8. The skilled artisan will recognize that each topology brings advantages and drawbacks including cost, complexity, and repeatability, among others.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls. The terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A power system comprising:
   a first battery subcircuit;
   a second battery subcircuit
   an electrochemical impedance spectroscopy (EIS) measurement circuit coupled to each of the first battery subcircuit and the second battery subcircuit; and
   a control circuitry coupled to the EIS measurement circuit, the control circuitry configured to perform an EIS test by:
      issuing a first control signal to transfer first energy from the first battery subcircuit to the second battery subcircuit; and
      synchronously measuring cell voltages and current in the second battery subcircuit as the first energy is transferred.

2. The power system of claim 1, wherein the control circuitry is further configured to perform the EIS test by:
   issuing a second control signal to transfer second energy from the second battery subcircuit to the first battery subcircuit; and
   synchronously measuring cell voltages and current in the first battery subcircuit as the second energy is transferred.

3. The power system of claim 2, wherein the first and second energy are approximately equal.

4. The power system of claim 1, wherein the EIS measurement circuit includes:
   a transformer having a primary winding and a secondary winding;
   a first current sensor configured to measure current in the first battery subcircuit;
   a second current sensor configured to measure current in the second battery subcircuit;
   a first switch configured to control current in the first battery subcircuit, the first switch coupling the first battery subcircuit to the transformer primary winding; and
   a second switch configured to control current in the second battery subcircuit, the second switch coupling the second battery subcircuit to the transformer secondary winding.

5. The power system of claim 4, wherein the control circuitry is configured to issue the first control signal to close the first switch, and issues a second control signal to close the second switch, such that the first energy is transferred form the first battery subcircuit to the transformer and then from the transformer to the second battery subcircuit.

6. The power system of claim 1, wherein the control circuitry determines a reference current, and applies a proportional-integral control strategy to control current in the second battery subcircuit by controlling a switch that controls transfer of the first energy.

7. The power system of claim 6, wherein the reference current is a time varying current configured to sweep through several frequencies during the EIS test.

8. The power system of claim 1, wherein the EIS measurement circuit includes a transformer for transferring power from the first battery circuit to the second battery circuit.

9. The power system of claim 8, wherein the EIS measurement circuit has a flyback converter design.

10. The power system of claim 8, wherein the EIS measurement circuit has an isolated full bridge converter design.

11. The power system of claim 8, wherein the EIS measurement circuit has an isolated half-bridge converter design.

12. The power system of claim 8, wherein the EIS measurement circuit has a push-pull converter design.

13. A method of monitoring battery status in a battery electric vehicle, the battery comprising a plurality of battery modules each including at least one battery, the method comprising:
taking first energy from a first battery module to provide excitation current for performing an electrochemical impedance spectroscopy (EIS) test on a second battery module;
synchronously measuring battery voltage and current in the second battery module in the EIS test; and
returning second energy to the first battery module, the second energy approximating the first energy.

14. The method of claim 13, wherein the battery electric vehicle includes an EIS circuit comprising a transformer for transferring energy from the first battery module to the second battery module.

15. An electrical architecture for measuring impedance of cells in a battery system using electrochemical impedance spectroscopy (EIS) comprising:
first, second and third inputs coupled to first and second battery circuits each having at least one battery, with the first and second inputs coupled to the first battery circuit, and the second and third inputs coupled to the second battery circuit, such that the second input is common to the first battery circuit and the second battery circuit;
first and second switches;
a transformer having first and second primary side nodes, and first and second secondary side nodes,
first and second current sensors; and
an EIS controller coupled to the first and second switches and the first and second current sensors;
wherein the EIS controller is configured to use the transformer and the first switch to issue a first excitation current to the second battery circuit using power taken from the first battery circuit, the first excitation current being an alternating current having a frequency.

16. The electrical architecture of claim 15, wherein the EIS controller is configured to use the transformer and the second switch to issue a second excitation current to the first battery circuit using power obtained from the second battery circuit.

17. The electrical architecture of claim 15, wherein the EIS controller is configured to use the transformer and the first switch to issue a first excitation current to the second battery circuit using power obtained from the first battery circuit by:
delivering a series of pulses to the first switch, each pulse closing the first switch to allow a first current to flow from the first battery circuit through the second input and to the first input through the first and second primary side nodes, the first switch, and the first current sensor, such that the transformer causes the first excitation current to flow from the third input to the second input through each of the first and second secondary side nodes and the second current sensor;
wherein the first current and the excitation current are each alternating currents approximately 180 degrees out of phase with one another.

18. The electrical architecture of claim 17, wherein the EIS controller is configured control current amplitude using pulse width modulation to generate the series of pulses by monitoring current flow using at least one of the first and second current sensors.

19. The electrical architecture of claim 15, wherein:
the first input is connected to the first primary side node;
the second input is coupled to the first switch and the first switch is coupled to the second primary side node;
the second input is also coupled to the second secondary side node; and
the third input is coupled to the second switch and the second switch is coupled to the first secondary side node.

20. A battery management unit (BMU) for first and second battery circuits comprising:
the electrical architecture of claim 15;
a BMU controller in the form of a microcontroller or microprocessor; and
at least one voltage sensor configured to sense a voltage of at least one of the first battery or second battery;
wherein the BMU controller is configured to:
issue control signals to the EIS controller to generate the first excitation current and vary the frequency of the first excitation current;
receive simultaneous measurements of current from the first and second current sensors and of voltage from the at least one voltage sensor; and
calculate impedance of at least one of the first battery or second battery as a function of frequency of the first excitation current.

\* \* \* \* \*